Aug. 9, 1966 R. J. MEDFORD 3,265,546

CHEMICAL DRILLING OF CIRCUIT BOARDS

Filed April 1, 1963

INVENTOR.
ROBERT J. MEDFORD

BY L. Lee Humphries

ATTORNEY

United States Patent Office 3,265,546
Patented August 9, 1966

3,265,546
CHEMICAL DRILLING OF CIRCUIT BOARDS

Robert J. Medford, Los Angeles, Calif., assignor to North American Aviation, Inc.
Filed Apr. 1, 1963, Ser. No. 269,453
1 Claim. (Cl. 156—3)

Figure 1:
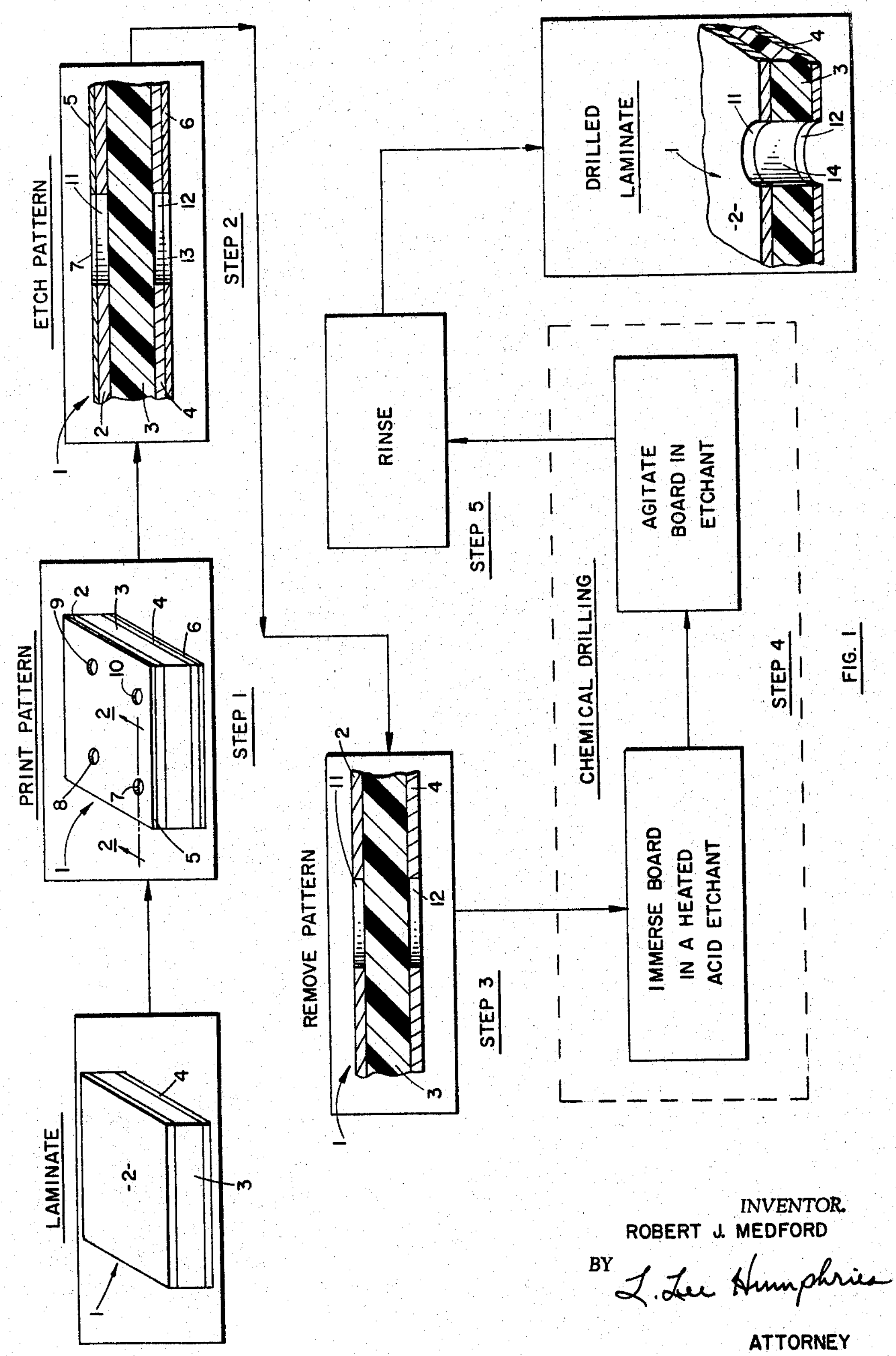

This invention relates to a process for drilling circuit boards, and more particularly to a process for drilling circuit boards by the use of a chemical etchant.

Present production programs involving electronics and other technologies require drilling thousands of holes in circuit boards as a part of the manufacture and production of advanced technical systems. The present method of drilling holes by use of a mechanical drill and drill press involves and requires considerable floor space, operators and machinery and as a result limits the numbers of boards that can be drilled in a given production period and thereby limits the number of systems which can be manufactured in a given production period.

In the device of this invention, a process utilizing selected chemicals in proper proportions are used to drill holes through circuit boards having a dielectric such as an epoxy glass layer and a metal layer on one side or wherein the dielectric is sandwiched between two layers of a metal such as copper. The process is adaptable to large scale mass production requiring a minimum of equipment and personnel and is comprised of steps requiring printing or masking hole patterns on the surface of the metal layer or layers as the case may be; subsequently etching a hole pattern through the metal portion to the dielectric layer according to the areas exposed by the printed pattern; by the use of a ferric chloride etchant or other etchants suitable for that purpose; stripping away the maskant printed on in the first step by immersing the board in acetone or other solvents until the maskant is removed; rinsing and drying the board afterwards; chemically drilling holes through the board where the holes had been etched previously through the metal portion by immersing the board into a fluosulfonic acid etchant heated to an optimum temperature value, and agitating the boards therein until the holes appear to have been etched through the laminate.

Therefore one of the objects of this invention is to provide a process for drilling holes through circuit boards by the use of a chemical solution.

Another object of this invention is to provide a process for drilling holes through circuit boards by agitating the boards in a fluosulfonic etchant maintained at a selected temperature.

Another object of this invention is to provide an improved method for drilling holes through circuit boards by the use of a fluosulfonic etchant solution.

Still another object of this invention is to provide a method for drilling holes through metal layers and a dielectric layer at a cost less than the cost required for mechanical drilling through the same layers.

Other objects, features and advantages of the present inventive process will appear from a reading of the following description of several examples of the process of the invention including a more preferred process, the said description being given in connection with the accompanying drawings of which, FIG. 1 is a schematic illustration of each major step of the process including a cross sectional view of the board from step one of the process through the final step.

Referring now to FIG. 1 wherein is illustrated laminated circuit board 1. Layers 2 and 4 of board 1 are comprised of a conductive metal such as copper cladding. The process illustrated utilizes a board comprised of three layers, although a board with two layers (one dielectric, one metal layer) may also be used without substantial change to the process steps. Sandwiched between the metal layers is a dielectric layer 3 comprised of epoxy glass, glass, a plastic material, a polyester and phenolic material, or some other type of dielectric material. Many different types of materials may be used as dielectric layer 3. The type of dielectric material being limited to materials which will etch when exposed to the etchants listed in Table I.

The steps of which this invention is comprised are illustrated in FIG. 1. A circuit hole pattern for electrical circuit connections is first printed on the top or bottom layers or both of board 1 by masking out all of the metal layers except circular areas defining hole locations shown as hole locations 7, 8, 9, and 10 in maskant layer 5. The pattern on the top must be approximately identical with a pattern on the bottom so that when drilling through the material layers of metal and dielectric the holes will coincide so that electrical circuit connections can be made between said layers. The maskant layers 5 and 6 are applied by methods such as silk screening, Kodak photo resist process. After the pattern defining hole locations has been printed, the board is next immersed in an etchant such as a ferric chloride etchant until the metal portions exposed after the pattern was printed on the board is etched away. Holes 11 and 12 through layers 2 and 4 and hole locations 11 and 12 defined by maskant layers 5 and 6 are shown in step two. After the holes have been etched through the layers 2 and 4 in step two, the maskant layers 5 and 6 are removed or stripped away by immersing the board in a solvent such as acetone and hydrochloric acid until it is dissolved. Removal of the maskant layers 5 and 6 is shown in FIG. 1 as step three of the process. Steps one, two, and three may be omitted in whole or in part if the pattern has previously been drilled through layers 2 and 4. If there is only one metal layer however and if the pattern of holes has been drilled in the one layer, then application of the maskant to the exposed dielectric layer 3 would be the only step required before the step designated as step 4 for chemical drilling. The board may then be rinsed in a fluid such as deionized water to remove maskant and solvent residues. Rinsing could be omitted; however, if the board is rinsed for example to improve reliability, etc., the optimum value for rinsing a board which previously had been etched by a ferric chloride etchant and which had previously had a maskant stripped away by the use of acetone and hydrochloric acid would be approximately one minute at room temperature. The board may also be ultrasonically cleaned for about one minute. After the board has dried it is then chemically drilled in step four by immersing it into a heated fluosulfonic acid etchant. The metal portions retained on the board serve as a maskant for the etching of the dielectric. The board is agitated in the solution until holes appear to be etched or drilled through the laminate. Hole 14 through dielectric layer 3 is shown in FIG. 1. Agitation may be achieved for example by rotating the boards in the solution by the use of an air driven stirrer, a reciprocating mechanical work rod (vertical and/or horizontal movement), ultrasonic agitation, air agitation, spray agitation whereby the etchant solvent is sprayed onto the masked hole pattern or by any combination of the above, etc. An optimum value for heating the fluosulfonic acid etchant is 148° F., although the etchant temperature may be varied over a wide range from 70° F. to 195° F. with the more rapid etching process occurring at the higher temperatures.

If the boards were agitated by rotating the boards with an air driven stirrer an optimum value for rotating the stirrer would be 86 revolutions per minute. Optimum range for agitation using a reciprocating mechanical work rod is from six to fifteen feet per minute. A preferred range for ultrasonic agitation is 20 to 25 kilocycles per second depending on the diameter of the hole. A preferred composition for the drilling etchant, fluosulfonic acid, is two parts of concentrated sulfuric acid (95%) and one part of concentrated hydrofluoric acid (70%). Other etchants are listed in Table I. The two chamicals react to form a fluosulfonic acid. The acid etchant is a stable liquid and dissociates only slightly even in moderate percentages of water, into hydrofluoric and sulfuric acids. However, a definite percentage of free HF is necessary (10% to 30%) to effectively etch the glass fibers. Fluosulfonic acid has only one of its hydroxyl groups replaced by florine. The acid retains its acidic nature and excellent etching characteristics towards the dielectric materials described herein, for example, the epoxy laminate, dielectric layer material 3 of board 1. The preferred etchment composition furnishes the sulfuric acid and hydrofluoric acid which results in the clean etching of the dielectric material. It is believed that the fluosulfonic acid etchant sulfonates the epoxy resin containing aromatics such as bisphenols, etc., and breaks either the linear or cross linkage or both. The reaction products are soluable except for the formation of a small percentage of sulfone. The products formed in dissolving the dielectric appear to be silicone tetrafluoride and hydrofluosilicic acid. The fluosulfonic acid used does not attack or etch away the copper clad laminate (except at temperatures above 160° F.), therefore a maskant is not employed except as previously indicated.

Another preferred etchant is two parts $H_2SO_4$ having a concentration range of from 93% to 98% and one part HF having a concentration of from 70% to 100%. The higher concentrations of HF aid glass removal particularly $SiF_4$ and lowers the water content in the systems.

Fuming sulfuric acid in various free $SO_3$ concentrations (from 1% to 50%) is another preferred etchant. The fuming sulfuric etchant which has a concentration of 100%, reduces the free water and improves sulfonation. However, only the 1% to 15% fuming $H_2SO_4$ is practical; the higher $SO_3$ concentrations result in slower etching. By using $H_2SO_4 \cdot SO_3$ (fuming sulfuric) the etching can be effected at a lower temperature so that a smoother etched surface is achieved.

Another preferred etchant is 700 cc.'s to 800 cc.'s (34% to 40%) of $H_2SO_4$ (93% concentration by weight), 1000 cc.'s to 1300 cc.'s (28% to 29%) of HF (70%), and 300 cc.'s to 550 cc.'s (17% to 21%) of $HSO_3F$ (98.5%) maintained over a temperature range of 110° F. to 148° F. (optimum 116° F. to 120° F.).

After drilling, the board is rinsed in step five.

A series of tests were conducted to determine additional etchants, etchant compositions, and etchant temperatures. Additional tests were conducted on selected etchants to determine speed of agitation, temperature, and time required to drill holes through the dielectric. Tables I and II list some of the results of the tests.

The time range for etching boards is determined by the thickness of the board, type of material being etched and degree of cure of the epoxy glass boards. Drill time is directly proportional to the thickness of the board, the time specified in connection with experiment one was taken for drilling boards having a thickness of 0.0625 an inch.

*Experiment one*

Laminates approximately 0.0625 inch thick comprised of epoxy glass dielectric layer 3 clad on two sides by copper layers 2 and 4 were immersed in 150 milliliters of a solution contained in 250 milliliter polyethylene beakers. The test circuit boards were removed periodically and examined for speed and efficiency of the etching solution. Agitation was employed when suitable attack on the test circuit was noted. Agitation was achieved by use of an air driven stirrer, a reciprocating mechanical work rod, and ultrasonic agitation. The experiments led to the determination of etchants listed in Table I.

TABLE I

| Experimental Etchants | Concentration, Percent by Wt. | Solution Temp., ° F. |
|---|---|---|
| 1. Sulfuric Acid | 60.0 | 78 |
| Hydrofluoric Acid | 1.3 | |
| Water | 38.7 | |
| 2. Sulfuric Acid | 60.0 | 78 |
| Hydrofluoric Acid | 11.0 | |
| Water | 29.0 | |
| 3. Ammonium Persulfate | 10.0 | 78 |
| Hydrofluoric Acid | 36.0 | |
| Water | 54.0 | |
| 4. Ammonium Persulfate | 26.0 | 78 |
| Hydrofluoric Acid | 27.0 | |
| Water | 47.0 | |
| 5. Acetone | 42.0 | 78 |
| Hydrofluoric Acid | 28.0 | |
| Water | 30.0 | |
| 6. Acetone | 28.0 | 78 |
| Acetic Acid | 36.0 | |
| Hydrofluoric Acid | 11.0 | |
| Water | 26.0 | |
| 7. Acetone | 28.0 | 150 |
| Acetic Acid | 37.0 | |
| Acetyl Acetone | 35.0 | |
| 8. Hydrofluoric Acid | 11.0 | 78 |
| Acetyl Acetone | 24.0 | |
| Potassium Iodide | 25.0 | |
| Water | 40.0 | |
| 9. Propylene Oxide | 100.0 | 78 |
| 10. Sodium Hydroxide | 20.0 | 78 |
| Lithium Carbonate | 20.0 | |
| Water | 60.0 | |
| 11. Sulfuric Acid | 15.0 | 78 |
| Propylene Oxide | 26.0 | |
| Water | 59.0 | |
| 12. Sulfuric Acid | 48.0 | 194 |
| Nitric Acid | 31.0 | |
| Water | 21.0 | |
| 13. Hydrochloric Acid | 38.0 | 78 |
| Water | 62.0 | |
| 14. Hydrofluoric Acid | 37.0 | 78 |
| Water | 63.0 | |
| 15. Hydrofluoric Acid | 17.5 | 135 |
| Sulfuric Acid | 40.0 | |
| Nitric Acid | 23.0 | |
| Water | 19.5 | |
| 16. Sulfuric Acid | 95.0 | 78 |
| Water | 5.0 | |
| 17. Nitric Acid | 69.7 | 78 |
| Water | 30.3 | |
| 18. Sulfuric Acid | 95.0 | 160 |
| Water | 5.0 | |
| 19. Nitric Acid | 69.7 | 130 |
| Water | 30.3 | |
| 20. Fluoboric Acid | 21.0 | 150 |
| Sulfuric Acid | 54.0 | |
| Water | 25.0 | |
| 21. Hydrofluoric Acid | 26.0 | 78 |
| Sulfuric Acid | 60.0 | |
| Water | 14.0 | |
| 22. Hydrofluoric Acid | 16.0 | 75–142 |
| Sulfuric Acid | 73.5 | |
| Water | 10.5 | |
| 23. Sodium Hydroxide | 10 to 60 | 80–190 |
| 24. Sulfuric Acid ($H_2SO_4$) | 34 to 40 | 110–148 |
| Hydrofluoric Acid (HF) | 28 to 29 | |
| Fluosulfonic Acid ($HSO_3F$) | 17 to 21 | |

Etchant 23 was used to etch through a dielectric layer of linear polyester material. Etchants 22 and 24 appear to etch cross-linked polyester. A water bath on an electric hot plate supplied the heat necessary to maintain the etchant at the temperatures listed. Agitation speed, which was determined by visually counting the number of revolutions past a reference point for a one interval when using the air driven stirrer, was varied for different boards from an approximate speed of 60 revolutions per minute to approximately 140 revolutions per minute. Since no strobe light was available, one side of the test board being agitated was marked and counted each revolution for a period of one minute using an accurate stop watch. During the experiments the boards were examined every thirty minutes to determine the degree of etch, the amount of undercutting, symmetry of the holes, and the products formed in the holes. Table II, following, shows the suitability of certain of the etchants used in the experiments.

TABLE II

| Circuit Board No. | Etchants from Table I | Speed of Agitation (r.p.m.) | Bath Temp., ° F. | Time (min.) Required to Drill Holes |
|---|---|---|---|---|
| 1 | 12 | None | 194 | 150 |
| 2 | 14 | ---- | 78 | ---- |
| 3 | 15 | 60 | 135 | 360 |
| 4 | 22 | 66 | 142 | 15 |
| 5 | 22 | None | 84 | 150 |
| 6 | 22 | 120 | 98 | 105 |
| 7 | 22 | 80 | 127 | 95 |
| 8 | 22 | 100 | 130 | 15 |
| 9 | 22 | 120 | 142 | 15 |
| 10 | 22 | 130 | 140 | 15 |
| 11 | 22 | 125 | 135 | 30 |
| 12 | 22 | 110 | 144 | 15 |
| 13 | 22 | 86 | 148 | 10 |
| 14 | 22 | 86 | 148 | 10 |
| (1) | 22 | (3) | 148 | 10–15 |
| (2) | 24 | (4) | [5] 110–148 | 10–18 |

[1] A series of tests was run on selected circuit boards using etchant number 22 from Table I and a reciprocating work rod as an agitator.

[2] A series of tests was conducted on boards having a thickness of approximately 0.0625 inch.

[3] 6–15 ft./min.

[4] 6/15 ft./min. (or) 66–90 r.p.m.

[5] Optimum 116–120.

By the use of ultrasonic agitation etch time was reduced from a range of 10 to 18 minutes achieved by the use of reciprocating work rod or air driven stirrer, to a range of from 6 to 11 minutes. Ultrasonic agitation within the range of 20 to 25 kilocycles was found to be satisfactory for holes having diameters of approximately 0.052 inch. Holes were symmetrical, sulfones and other derivatives were more effectively removed from the etched holes. The use of ultrasonic agitation in connection with etchants 22 and 24 on boards having thicknesses of from 0.004 inch to 0.008 inch reduced drill time to approximately one to two minutes depending on the board thickness, material, and degree of cure of the material. Otherwise all boards tested were attached perpendicularly to a reciprocating work rod which was moved linearly through the etchant by means of a variable speed reciprocating motor. The rod speed was measured by counting the distance the rod moved in one interval of time. Experiments were also run using other etchants in Table I including the preferred etchants discussed herein.

As indicated above etchant 22 with agitation required ten minutes to chemically drill through a 0.0625 inch epoxy glass laminate. The holes were found to be symmetrical and smooth. Best results were obtained with the etchant 22 heated to 148° F. and agitated at 86 revolutions per minute or from six to fifteen feet per minute, or with etchant 24 heated to approximately 118° F. and agitated as indicated above.

*Experiment two*

Using the same apparatus, boards, agitating devices as were used in connection with experiment one, after the copper was etched away the boards were dipped into a container filled with etchant 22 and agitated as before. Depending on the thickness, type of material including degree of cure, the boards remain in the container filled with the etchant for approximately six to ten minutes. (Boards having thicknesses less than 0.0625 inch, for example, from 0.004 inch to 0.030 inch require less time. Drilling rate is approximately related to thickness of the board.) After six to ten minutes or until the hole is almost drilled through the board, the board is taken from a solution one and immersed into a solution two for a period of approximately thirty to ninety seconds depending as before on thickness, material, etc. It was found that the boards were more precisely etched and that the time was reduced significantly. It was found that etchant 22 as a solution one and etchant 24 as a solution two produced favorable results. For example container one may have etchant 22 maintained within the temperature range specified within Table I in connection with Experiment One. Container two may also be filled with etchant 22 or container two may be filled with etchant 24. Equally good results are obtained if container one is filled with etchant 24 and container two is filled with either etchant 22 or etchant 24. Other combinations also produced precision etching.

*Summary*

A circuit pattern is applied to both surfaces or one surface, as the case may be, of a copper clad circuit board leaving exposed areas of the copper which define a hole pattern. The board may be either two or three layers having one dielectric layer and one metal layer or two metal layers. Instead of drilling these holes by mechanical drilling using a drill press, a copper was first etched away by a ferric chloride etchant for two or three minutes in accordance with known processes. After the hole pattern has been etched through the copper down to the dielectric layer sandwiched between the copper cladding, the maskant used to define the hole pattern is removed and the board is cleaned. The next step comprises the step of chemically drilling through the dielectric material. The board is chemically drilled by immersing it into a preferred composition of fluosulfonic acid etchant heated to a preferred temperature. The boards in the solution are agitated at an optimum value until the holes appear drilled through the laminate. Usually the drilling operation takes approximately ten minutes or less depending on agitation, etchant, board thickness, etc.

Although the invention has been described and illustrated in detail, it is to be clearly understood that the same is by way of illustration and example only and is not to be taken by way of limitation, the spirit and scope of this invention being limited only by the terms of the appended claim.

I claim:

A process comprising chemically etching holes through an electrical circuit board, said board comprising at least a metal layer and a dielectric layer, said dielectric layer comprised of an epoxy resin-glass material;

comprising selectively chemically etching holes through said metal layer to the dielectric layer at locations selected for electrical connections through said dielectric layer;

and second selectively chemically etching holes through said dielectric exposed after etching holes through said metal layer, said chemical etching comprised of immersing said board in a heated fluosulfonic acid etchant ($HSO_3F$) and agitating said board in said etchant until holes suitable for electrical connections extend through the dielectric layer said fluosulfonic acid being the reaction product of concentrated sulfuric acid ($H_2SO_4$) and concentrated hydrofluoric acid (HF) maintained at a temperature within the range of 75 to 160° F.

References Cited by the Examiner

UNITED STATES PATENTS

| | | | |
|---|---|---|---|
| 378,423 | 2/1888 | Baynes | 156—11 |
| 2,421,607 | 6/1947 | Fowler | 156—3 X |
| 2,536,383 | 1/1951 | Mears et al. | 156—11 X |
| 3,042,566 | 7/1962 | Hardy | 156—18 |
| 3,042,591 | 7/1962 | Cado. | |
| 3,046,176 | 7/1962 | Bosenberg | 156—11 |
| 3,081,203 | 3/1963 | Beuscher. | |
| 3,113,855 | 12/1963 | Elmer | 156—24 X |
| 3,186,883 | 6/1965 | Frantzen | 156—7 |

OTHER REFERENCES

IBM Tech. Discl. Bul., vol. 6, No. 8, Jan. 8, 1964.

ALEXANDER WYMAN, *Primary Examiner.*

JACOB STEINBERG, *Examiner.*